(12) United States Patent
Taniguchi

(10) Patent No.: US 10,784,109 B2
(45) Date of Patent: Sep. 22, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Tomohiro Taniguchi, Nomi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/181,872

(22) Filed: Nov. 6, 2018

(65) Prior Publication Data

US 2020/0066534 A1   Feb. 27, 2020

(30) Foreign Application Priority Data

Aug. 21, 2018   (JP) ................... 2018-154586

(51) Int. Cl.
  *H01L 21/285* (2006.01)
  *H01L 29/66* (2006.01)
  *H01L 29/45* (2006.01)
  *H01L 29/739* (2006.01)

(52) U.S. Cl.
  CPC ........ *H01L 21/2855* (2013.01); *H01L 29/456* (2013.01); *H01L 29/66348* (2013.01); *H01L 29/7397* (2013.01); *H01L 2224/32245* (2013.01); *H01L 2924/13055* (2013.01)

(58) Field of Classification Search
  CPC .......... H01L 21/2855; H01L 29/66348; H01L 29/456; H01L 29/7397; H01L 2924/13055; H01L 2924/32245
  See application file for complete search history.

(56) References Cited

U.S. PATENT DOCUMENTS

2017/0186714 A1* 6/2017 Nakata ................. H01L 24/05
2017/0278929 A1* 9/2017 Imagawa ............. H01L 29/1095
2017/0320157 A1* 11/2017 Zhang .................. B23K 9/1006

FOREIGN PATENT DOCUMENTS

| JP | 59-46047    | 3/1984  |
| JP | 8-300165    | 11/1996 |
| JP | 2013-63458  | 4/2013  |

* cited by examiner

*Primary Examiner* — Patricia D Reddington
(74) *Attorney, Agent, or Firm* — Oblon, McClelland, Maier & Neustadt, L.L.P.

(57) ABSTRACT

A semiconductor device includes a semiconductor layer and a metal electrode. The metal electrode is provided on the semiconductor layer. The metal electrode includes first to third metal regions. The first metal region contacts the semiconductor layer and includes a first metal element as a main component. The second metal region is provided on the first metal region and includes a second metal element as a main component. The third metal region is provided on the second metal region. The third metal region has a thickness in a first direction directed from the semiconductor layer toward the second metal region. The thickness of the third metal region is larger than a total thickness in the first direction of the first metal region and the second metal region. The second metal element has a standard free energy of oxide generation larger than that of the first metal element.

11 Claims, 4 Drawing Sheets

SEMICONDUCTOR DEVICE

CROSS-REFERENCE TO RELATED APPLICATIONS

This application is based upon and claims the benefit of priority from Japanese Patent Application No. 2018-154586, filed on Aug. 21, 2018; the entire contents of which are incorporated herein by reference.

FIELD

Embodiments relate to a semiconductor device.

BACKGROUND

A semiconductor device that controls high voltage and large current has a configuration in which multiple semiconductor elements are disposed between two electrode plates and the electrode plates are pressure contacted to the semiconductor elements. A semiconductor element used for such a semiconductor device is desired to have a metal electrode with a sufficient thickness for mitigating the pressure concentration applied from the electrode plates.

DETAILED DESCRIPTION

Figure 1:
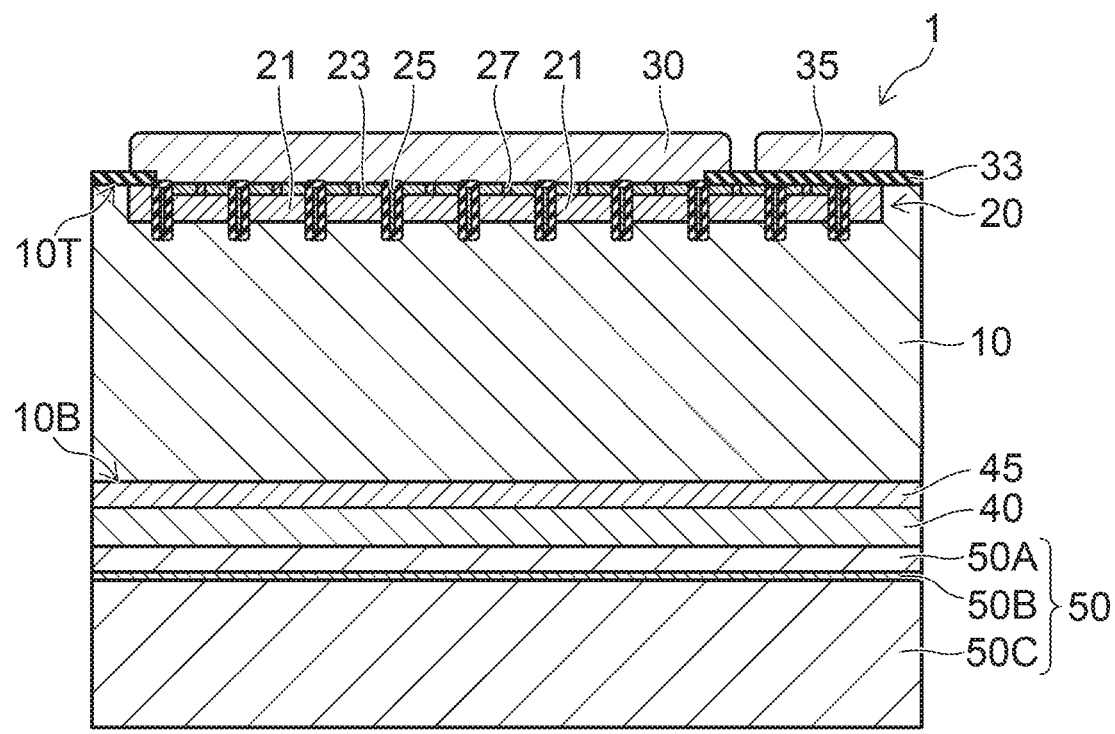
FIG. 1 is a schematic cross sectional view showing a semiconductor element according to an embodiment.

According to one embodiment, a semiconductor device includes a semiconductor layer and a metal electrode. The metal electrode is provided on the semiconductor layer. The metal electrode includes first to third metal regions. The first metal region contacts the semiconductor layer and includes a first metal element as a main component. The second metal region is provided on the first metal region and includes a second metal element as a main component. The third metal region is provided on the second metal region. The third metal region has a thickness in a first direction directed from the semiconductor layer toward the second metal region. The thickness of the third metal region is larger than a total thickness in the first direction of the first metal region and the second metal region. The second metal element has a standard free energy of oxide generation larger than a standard free energy of oxide generation of the first metal element.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross sectional view showing a semiconductor element (hereinafter, a semiconductor chip 1) according to an embodiment. The semiconductor chip 1 is, for example, an Insulated Gate Bipolar Transistor (IGBT). The semiconductor chip 1 is, for example, used as a switching element for power control.

As shown in FIG. 1, the semiconductor chip 1 includes an N-type base layer 10, and a Metal-Oxide-Semiconductor (MOS) structure 20 provided on an upper surface (10T) side of the N-type base layer 10. The semiconductor chip 1 includes a P-type collector layer 40 and an N-type buffer layer 45 provided below the N-type base layer 10.

The N-type base layer 10 is, for example, an N-type silicon layer. The MOS structure 20 includes a P-type base layer 21, an N-type emitter layer 23, and a gate electrode 25. The gate electrode 25 is, for example, provided in a gate trench having a depth enough to reach the N-type base layer 10 from an upper surface level of the N-type emitter layer 23. The gate electrode 25 faces the P-type base layer 21 via a gate insulating film.

The N-type buffer layer 45 is provided between the N-type base layer 10 and the P-type collector layer 40. The N-type buffer layer 45 includes N-type impurities of a higher concentration than an N-type impurity concentration in the N-type base layer 10.

The semiconductor chip 1 further includes an emitter electrode 30, a gate pad 35, and a collector electrode 50.

The emitter electrode 30 is provided above the N-type emitter layer 23 and the gate electrode 25. The emitter electrode 30 contacts the N-type emitter layer 23. The emitter electrode 30 is electrically connected to the P-type base layer 21 via a P-type contact layer 27. The P-type contact layer 27 is, for example, provided in the N-type emitter layer 23 and contacts the P-type base layer 21.

The gate pad 35 is provided above the N-type base layer 10 via an interlayer insulating film 33. The gate pad 35 is electrically insulated from the N-type base layer 10, the P-type base layer 21, the N-type emitter layer 23, and the P-type contact layer 27 by the interlayer insulating film 33. The gate pad 35 is electrically connected to the gate electrode 25 in a portion not shown.

The collector electrode 50 is provided below a back surface 10B of the N-type base layer 10. The P-type collector layer 40 is positioned between the N-type buffer layer 45 and the collector electrode 50, and contacts the collector electrode 50.

The collector electrode 50 includes a first metal region 50A, a second metal region 50B, and a third metal region 50C. The first metal region 50A contacts the P-type collector layer 40, and spreads in the X-direction and the Y-direction along the P-type collector layer 40. The first metal region 50A includes, for example, aluminum (Al) or titanium (Ti) as a main component.

The second metal region 50B is provided between the first metal region 50A and the third metal region 50C. A main component of the second metal region 50B is a metal element having a standard free energy of oxide generation larger than that of a metal element which is the main component of the first metal region 50A. The second metal region 50B includes, for example, one of magnesium (Mg), lithium (Li), calcium (Ca), and aluminum (Al) as the main component. The main component of the second metal region 50B is a metal element having the standard free energy of oxide generation, in a temperature range not more than 1400° C., larger than that of the metal element which is the main component of the first metal region 50A.

The third metal region 50C is provided so as to have a thickness in the Z-direction thicker than a total thickness in the Z-direction of the first metal region 50A and the second metal region 50B. The third metal region 50C has, for example, a thickness in the Z-direction not less than 3 micrometers (μm) and not more than 25 μm.

The third metal region 50C may include an metal element as a main component, which is same as the main component of the first metal region 50A. For example, the first metal region 50A includes aluminum (Al) as the main component, and the third metal region 50C also includes aluminum (Al) as the main component.

The third metal region 50C may include the same metal element as the metal element that is the main component of the second metal region 50B. For example, the first metal region 50A includes titanium (Ti) as the main component, and the second metal region 50B and the third metal region 50C include aluminum (Al) as the main component. For example, the first metal region 50A is titanium or titanium compound, the second metal region 50B is aluminum alloy, and the third metal region 50C is aluminum. The second metal region 50B and the third metal region 50C may be formed into one body.

Figure 2:
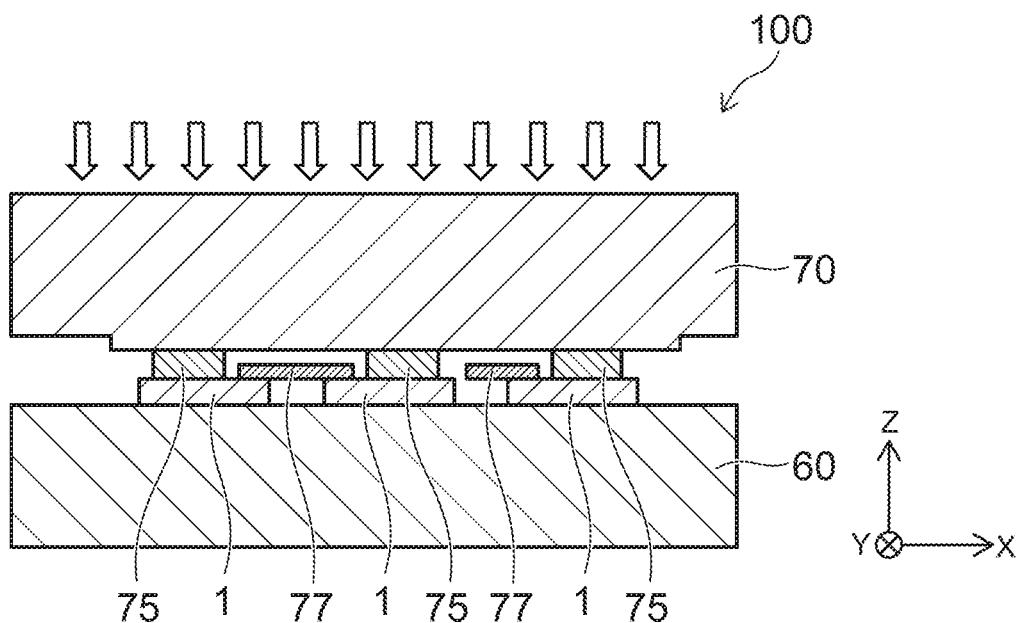
FIG. 2 is a schematic cross sectional view showing a semiconductor device according to the embodiment.

FIG. 2 is a schematic cross sectional view showing the semiconductor device 100 according to the embodiment. Apparatus such as an inverter or a converter for power conversion are configured to obtain a prescribed breakdown voltage, for example, by stacking multiple semiconductor devices 100.

As shown in FIG. 2, the semiconductor device 100 includes a semiconductor chip 1, a first electrode plate 60 and a second electrode plate 70. The multiple semiconductor chips 1 are disposed between the first electrode plate 60 and the second electrode plate 70. The multiple semiconductor chips 1 are connected in parallel to the first electrode plate 60 and the second electrode plate 70. The first electrode plate 60 is electrically connected to, for example, the collector electrode 50 of the semiconductor chip 1. The second electrode plate 70 is electrically connected to the emitter electrode 30 of the semiconductor chip 1.

As shown in FIG. 2, a metal spacer 75 is disposed between the semiconductor chip 1 and the second electrode plate 70. The metal spacer 75 is, for example, a metal plate. The metal spacer 75 is electrically connected to the emitter electrode 30 of the semiconductor chip 1. The metal spacer 75 has a thickness in the Z-direction that can secure a space for disposing a gate interconnection 77 between the semiconductor chip 1 and the second electrode plate 70. The gate interconnection 77 is electrically connected to the gate pad 35 (see FIG. 1) of the semiconductor chip 1.

The semiconductor device 100 has the configuration in which the semiconductor chip 1 and the metal spacer 75 are pressure connected to the first electrode plate 60 and the second electrode plate 70 by, for example, a pressure applied from above the second electrode plate 70. For example, in order to avoid physical destruction (crack and chipping) of the semiconductor chip 1, the collector electrode 50 is made of, for example, a soft (low hardness) metal having a thickness in the Z-direction not less than 5 μm and not more than 15 μm. That is, the collector electrode 50 is deformed when being pressured, and local concentration of the pressure can be mitigated between the semiconductor chip 1 and the first electrode plate 60. Similarly, the metal spacer 75 contacting the emitter electrode 30 is also preferable to be made of a soft metal material.

Figure 3:
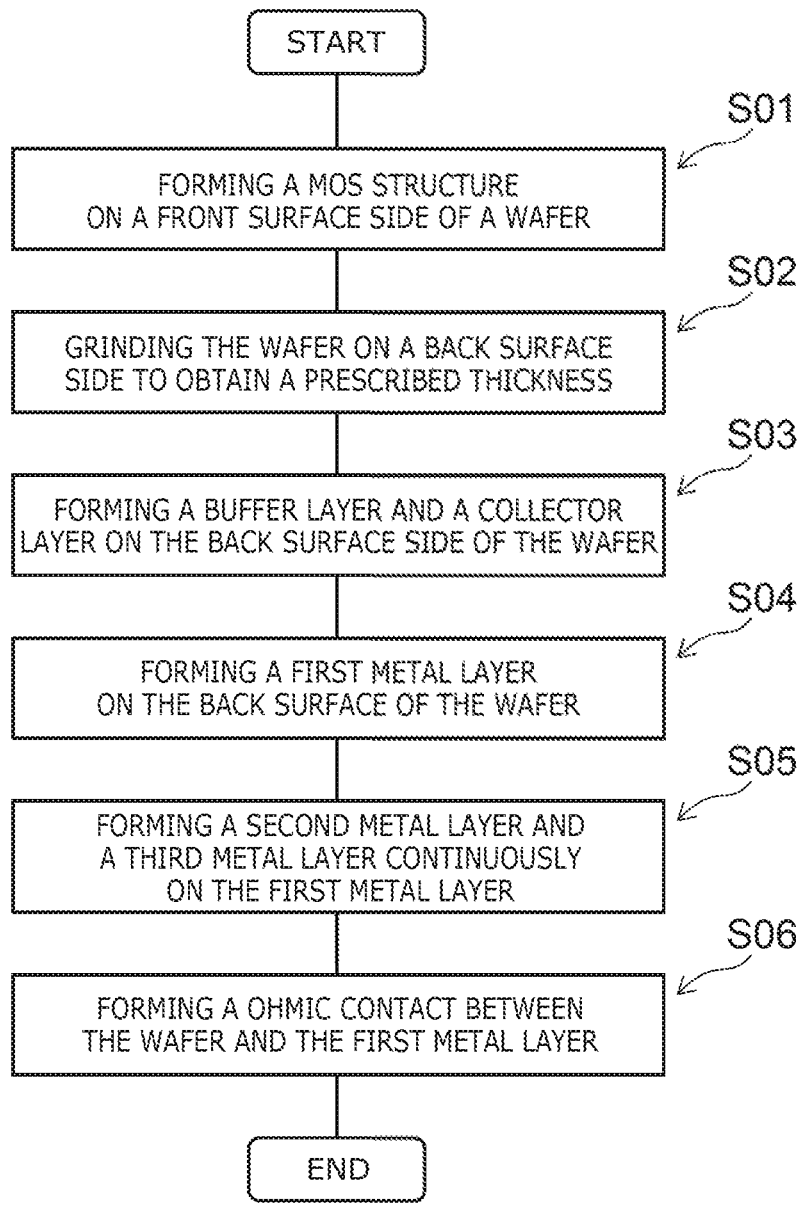
FIG. 3 is a flow chart showing a method for manufacturing the semiconductor element according to the embodiment.
Figure 4A:
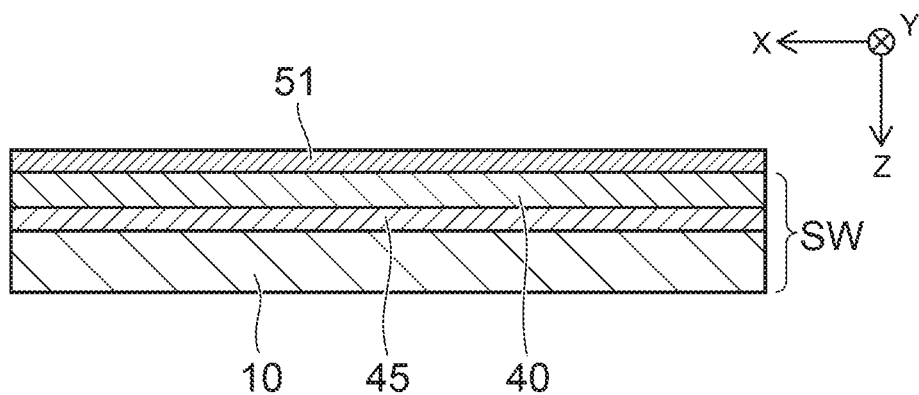
FIGS. 4A to 4C are schematic cross sectional views showing manufacturing processes of the semiconductor element according to the embodiment.
Figure 4B:
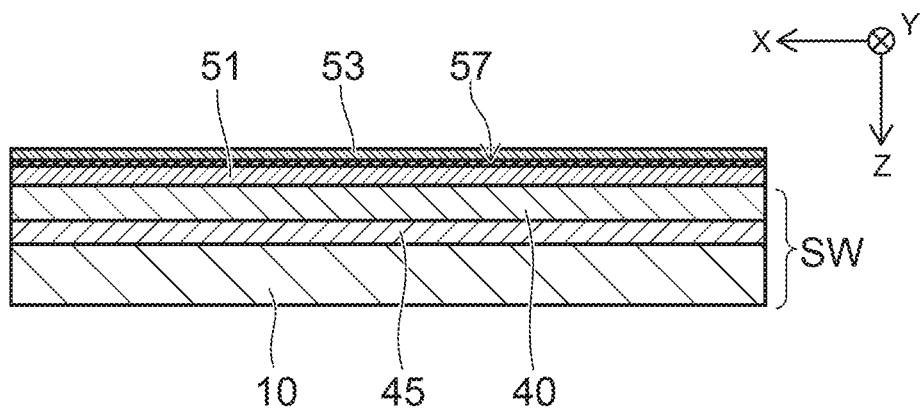
Figure 4C:
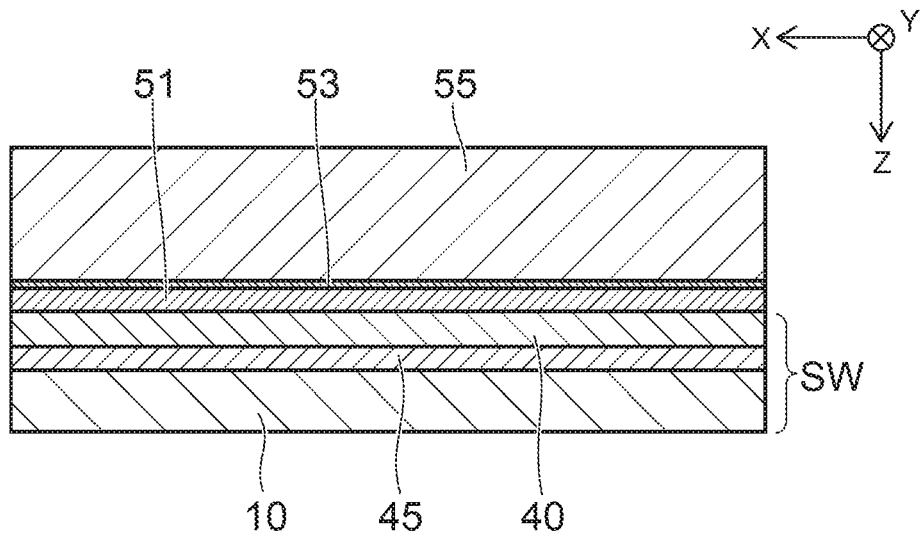
Figure 5:
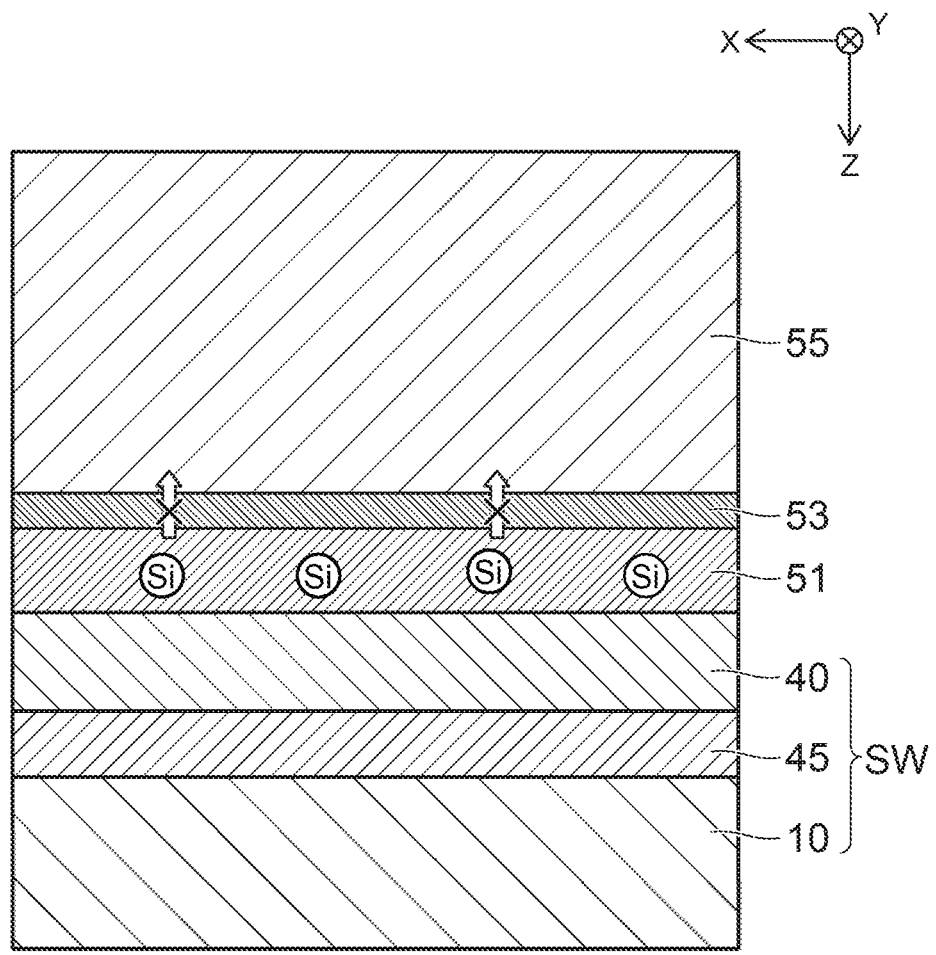
FIG. 5 is a schematic cross sectional view showing characteristics of the semiconductor element according to the embodiment.

Next, with reference to FIG. 3, FIGS. 4A to 4C and FIG. 5, a method for manufacturing the semiconductor chip 1 according to the embodiment will be described. FIG. 3 is a flow chart showing the method for manufacturing the semiconductor chip 1. FIGS. 4A to 4c are schematic cross sectional views showing manufacturing processes of the semiconductor chip 1. FIG. 5 is a schematic cross sectional view showing characteristics of the semiconductor chip 1.

As shown in step S01 of FIG. 3, the MOS structure 20 is formed on a semiconductor body, for example, a semiconductor wafer SW (see FIG. 4A). The semiconductor wafer SW is for example, an N-type silicon wafer. The semiconductor wafer SW is not limited to a silicon wafer, and may be one made of material such as silicon carbide (SiC), gallium arsenide (GaAs) and gallium nitride (GaN). The MOS structure is not limited to a trench gate type structure shown in FIG. 1, and may be a planar gate type structure.

Subsequently, after the emitter electrode 30 and the gate pad 35 are formed, the semiconductor wafer SW is processed to have a prescribed thickness by grinding, polishing or etching the back surface of the semiconductor wafer SW (S02).

Further, the P-type collector layer 40 and the N-type buffer layer 45 are formed on the back side of the semiconductor wafer SW (S03). The P-type collector layer 40 and the N-type buffer layer 45 are formed, for example, by ion-implanting a P-type impurity and an N-type impurity into the semiconductor wafer SW on the back side thereof.

Then, a first metal layer 51 is formed on the back surface of the semiconductor wafer SW (S04).

As shown in FIG. 4A, the first metal layer 51 is formed on the P-type collector layer 40. The first metal layer 51 is formed, for example, using a sputtering method. The first metal layer 51 is, for example, a metal layer including aluminum (Al) as a main component. The first metal layer 51 may include an element constituting the semiconductor wafer. For example, the first metal layer 51 includes silicon (Si). The first metal layer 51 preferably includes silicon at a ratio equal to or more than a solid solubility limit of silicon in aluminum at a temperature of contact annealing.

Subsequently, a second metal layer 53 and a third metal layer 55 are formed in order on the first metal layer 51 (S05). The second metal layer 53 and the third metal layer 55 are formed, for example, using a vapor deposition method. The second metal layer 53 is a metal layer including, for example, magnesium (Mg) as a main component. The third metal layer 55 is a metal layer including, for example, aluminum (Al) as a main component.

As shown in FIG. 4B, the second metal layer 53 is formed on the first metal layer 51. At this time, a natural oxide film 57 may be formed on a surface of the first metal layer 51.

For example, when aluminum which is the main component of the first metal layer 51 is oxidized, an aluminum oxide film that is an insulating film is formed on the surface of the first metal layer 51. The second metal layer 53 is a metal layer including magnesium as the main component, which has a standard free energy of oxide generation larger than that of aluminum. Thus, after the deposition of magnesium starts to form the second metal layer 53, the natural oxide film 57 starts to be reduced as the magnesium adhesion increases on the first metal layer 51.

As shown in FIG. 4C, after forming the second metal layer 53, the third metal layer 55 is formed continuously. For example, the first metal layer 51 corresponds to the first metal region 50A in FIG. 1. The second metal layer 53 also corresponds to the second metal region 50B; and the third metal layer 55 corresponds to the third metal region 50C.

For example, in the process of forming the third metal layer 55, the natural oxide film 57 positioned between the first metal layer 51 and the second metal layer 53 is reduced, and an electrical resistance between the first metal layer 51 and the second metal layer 53 is decreased. Thereby, the collector electrode 50 with a low resistance can be obtained.

Subsequently, for example, an ohmic contact between the semiconductor wafer SW (P-type collector layer 40) and a first metal layer 51 is formed by a heat treatment (S06).

In the case where the third metal layer 55 is a high purity aluminum layer and the second metal layer 53 is not provided, for example, silicon atoms are diffused from the first metal layer 51 into the third metal layer 55 during the heat treatment. As a result, in the first metal layer 51 including aluminum as the main component, a ratio of silicon to aluminum decreases, and an alloying reaction proceeds between the semiconductor wafer SW and aluminum in the first metal layer 51. In this process, spike-shaped protrusions are formed at an interface between the semiconductor wafer SW and the first metal layer 51. The spike-shaped protrusions include a metal, i.e., aluminum as a main component same as the main component of the first metal layer 51. Such a protrusion may penetrate into the P-type collector layer 40 and reach the N-type buffer layer 45, and degrades the characteristics of the semiconductor chip 1.

As shown in FIG. 5, by providing the second metal layer 53, it is possible to suppress the diffusion of silicon atoms from the first metal layer 51 into the third metal layer 55. That is, the ratio of silicon to aluminum is maintained in the first metal layer 51, suppressing the alloying reaction between the semiconductor wafer SW and aluminum in the first metal layer 51. Thereby, it is possible to uniformly form the interface between the semiconductor wafer SW and the first metal layer 51, thereby improving the manufacturing yield.

As described above, in the manufacturing process of the semiconductor element according to the embodiment, the first metal layer 51 is formed using the sputtering method, and then, the second metal layer 53 and the third metal layer 55 are formed using the vapor deposition method. For example, the sputtering method makes it possible to form a metal layer having a desired composition with superior reproducibility, and to form a low resistance ohmic contact between the semiconductor wafer SW and the first metal layer 51. However, it takes a long time to form a thick metal layer using the sputtering method. Thus, forming the first metal layer 51 to the third metal layer 55 using the sputtering method is not practical in view of the production efficiency. Accordingly, the second metal layer 53 and the third metal layer 55 are formed using the vapor deposition method that is suitable for forming the thick metal layer.

Moreover, the third metal layer 55 formed using the vapor deposition method has a metal density lower than the density of the first metal layer 51 which is formed using the sputtering method and includes the main component of the same metal element. For example, in the case where the metal layer including aluminum (Al) as the main component is used, the first metal layer 51 formed using the sputtering method has a metal density higher by 3% or more than the density of the third metal layer 55 formed using the vapor deposition method. The metal density is measured, for example, using X-ray transmission.

On the other hand, in the case where the first metal layer 51 and a metal layer thereon are not continuously formed, and the semiconductor wafer SW is exposed to ambient air after the first metal layer 51 is formed, the natural oxide film 57 is formed on the surface of the first metal layer 51. Thereby, the electrical resistance increases between the first metal layer 51 and the metal layer formed thereon. In the embodiment, the second metal layer 53 is formed, of which the main component is the metal element having the standard free energy of oxide generation larger than that of the main component of the first metal layer 51. Thereby, the natural oxide film 57 is reduced, and the collector electrode 50 can be formed with lower electrical resistance.

In the case where titanium (Ti) is used as the first metal layer 51, the metal layer including aluminum (Al) as the main component is formed as the second metal layer 53. Thereby, titanium oxide formed on the surface of the first metal layer 51 is reduced, and the collector electrode 50 is obtained with lower electrical resistance. The second metal layer 53 including one of magnesium (Mg), lithium (Li), and calcium (Ca) as the main component may be formed on the first metal layer 51 including titanium as the main component.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device comprising:
   a semiconductor body including a first semiconductor layer of a first conductivity type;
   a first electrode electrically connected to the semiconductor body;
   a second electrode electrically connected to the semiconductor body, the semiconductor body being positioned between the first electrode and the second electrode; and
   a control electrode provided between the semiconductor body and the first electrode, the control electrode being electrically insulated via an insulating film from the semiconductor body and the first electrode,
   the semiconductor body including a second semiconductor layer of a second conductivity type and a third semiconductor layer of the first conductivity type, the second semiconductor layer being provided between the first semiconductor layer and the first electrode, the third semiconductor layer being provided between the second semiconductor layer and the first electrode, the third semiconductor layer being electrically connected to the first electrode,
   the second electrode including first to third metal regions, the first metal region contacting the semiconductor body and including a first metal element as a main component, the second metal region being provided between the first metal region and the third metal region, the second metal region including a second metal element as a main component, the third metal region having a thickness in a first direction directed from the first electrode toward the second electrode, the thickness of the third metal region being larger than a total thickness in the first direction of the first metal region and the second metal region, the second metal element having a standard free energy of oxide generation larger than a standard free energy of oxide generation of the first metal element.

2. The device according to claim 1, wherein the third metal region includes a third metal element as a main component, the third metal element being different from the second metal element.

3. The device according to claim 2, wherein the first metal element is same as the third metal element.

4. The device according to claim 1, wherein the first metal element is aluminum (Al) or titanium (Ti), and the second metal element is one of magnesium (Mg), lithium (Li) or calcium (Ca).

5. The device according to claim 1, wherein the first metal element is titanium (Ti), and the second metal element is aluminum (Al).

6. The device according to claim 1, wherein the semiconductor body includes a fourth semiconductor layer of the second conductivity type, the fourth semiconductor layer being provided between the first semiconductor layer and the second electrode, the fourth semiconductor layer being electrically connected to the second electrode.

7. The device according to claim 6, wherein the semiconductor body includes a fifth semiconductor layer of the first conductivity type, the fifth semiconductor layer being provided between the first semiconductor layer and the fourth semiconductor layer, the fifth semiconductor layer including first conductivity type impurities of a concentration higher than a concentration of first conductivity type impurities in the first semiconductor layer.

8. The device according to claim 1, wherein the control electrode is disposed to face a portion of the second semiconductor layer via the insulating film.

9. The device according to claim 8, wherein the control electrode is disposed inside a trench provided in the semiconductor body.

10. The device according to claim 1, wherein the control electrode is provided in a plurality, the plurality of control electrodes being arranged in a second direction along a surface of the semiconductor body, and the first electrode is electrically connected to the third semiconductor layer between adjacent two control electrodes of the plurality of control electrodes.

11. The device according to claim 1, further comprising:

a first electrode plate electrically connected to the first electrode;

a second electrode plate electrically connected to the second electrode, the first electrode, the second electrode and the semiconductor body being positioned between the first electrode plate and the second electrode plate; and a control interconnection disposed between the first electrode plate and the second electrode plate, the control interconnection being electrically connected to the control electrode.

* * * * *